United States Patent [19]
Klein et al.

[11] Patent Number: 5,491,685
[45] Date of Patent: Feb. 13, 1996

[54] SYSTEM AND METHOD OF DIGITAL COMPRESSION AND DECOMPRESSION USING SCALED QUANTIZATION OF VARIABLE-SIZED PACKETS

[75] Inventors: Mark D. Klein, Cupertino; Dana Keen, Palo Alto, both of Calif.

[73] Assignee: Digital Pictures, Inc., San Mateo, Calif.

[21] Appl. No.: 246,110

[22] Filed: May 19, 1994

[51] Int. Cl.$^6$ ............................................. H04B 14/06
[52] U.S. Cl. .......................... 370/7; 370/82; 375/244; 348/406; 348/409; 348/420
[58] Field of Search ........................ 333/14; 455/72; 370/7, 82, 83, 118; 375/27, 30, 31, 122; 395/2.1, 2.33, 2.34, 2.38, 2.39; 348/400, 401, 404, 406, 409, 410, 420, 421; 341/67, 76, 139, 143

[56] References Cited

U.S. PATENT DOCUMENTS

| | | | |
|---|---|---|---|
| 4,719,642 | 1/1988 | Lucas | 375/30 |
| 4,882,585 | 11/1989 | Beard | 375/30 |
| 4,982,282 | 1/1991 | Saito et al. | 348/406 |
| 5,049,990 | 9/1991 | Kondo et al. | 348/421 |
| 5,121,202 | 6/1992 | Tanoi | 348/409 |
| 5,307,177 | 4/1994 | Shibata et al. | 348/420 |

*Primary Examiner*—Benedict V. Safourek
*Attorney, Agent, or Firm*—Amir H. Raubvogel

[57] ABSTRACT

A system and method of compressing and decompressing a digital signal using scaled quantization of variable-sized packets of difference samples. Difference samples are generated and subdivided into packets. Packet boundaries may be moved to maximize resolution. A scale value is established for each packet, and scaled samples are generated for the difference samples. Packet boundaries, scale values, and scaled samples are then output as the compressed signal. Decompression is performed by multiplying scaled samples by the appropriate scale value. The resulting set of decompressed difference samples are sequentially added to an initial sample to produce a decompressed signal.

24 Claims, 14 Drawing Sheets

SYSTEM AND METHOD OF DIGITAL COMPRESSION AND DECOMPRESSION USING SCALED QUANTIZATION OF VARIABLE-SIZED PACKETS

BACKGROUND OF THE INVENTION

1. Field of the Invention

This invention relates to the field of digital audio and video compression, and, more particularly, to a system and method of compressing and decompressing digital audio and/or video information by subdivision into variable-sized packets followed by dynamic scaled quantization.

2. Description of the Related Art

Although the following discussion emphasizes digital audio storage and compression, the techniques described herein relate to digital video storage and compression as well.

Techniques of digital storage of audio and video information are well known in the art, in particular with regard to audio compact discs (CDs) and compact disc read-only-memory (CD-ROMs). Standards for storing audio information in digital form have been established (International ElectroTechnical Commission, *International Standard—Compact Disc Digital Audio System*, 1987, also known as "Red Book"). Digital compression reduces the data volume required to store digitally-encoded source material on a disc, thus providing many advantages, including facilitating storage of large amounts of such source material on limited data storage media. This is useful, for example, for storage of both video and audio information on common media.

Many digital compression techniques exist in the related art. The following examples of existing compression systems apply primarily to digital audio information, although they may also be used for video compression. Further examples and more detailed descriptions may be found in Parsons, *Voice and Speech Processing*, McGraw-Hill, Inc., 1987.

1) Reduced Sample Word Width: This technique involves discarding the less significant bits of each sample. Thus, for a sample of M bits, only the most significant N bits are stored on the disc, where N is less than M. Although this scheme is relatively simple, it results in an unacceptably low dynamic range (approximately 6*N decibels) and inferior signal-to-noise ratio.

2) Reduced Sample Rate: Here the signal bandwidth is reduced by lowering the number of samples per second. One major disadvantage of this scheme is the relatively expensive hardware required in re-sampling to a higher output rate.

3) Adaptive Differential Pulse Code Modulation (ADPCM): ADPCM generates a difference signal, which represents the difference between one sample and the next. Predictors are then derived and stored. ADPCM produces output of acceptable quality, but decompression is computationally complex. See Parsons, pp. 234–44.

4) Frequency Domain Compression: A frequency-domain analysis is performed on the signal to determine the frequencies at which the signal contains energy. Only the frequencies containing energy are stored. This technique is computationally complex, generally requiring random-access memory (RAM) for decompression. See, for example, Schwartz, U.S. Pat. No. 4,474,747 issued Sep. 18, 1984 for "Audio Digital Recording and Playback System ".

5) Adaptive Delta Modulation: A difference signal is developed as in ADPCM. Each difference quantity is scaled according to a step size that varies based on the nature of the signal. Decompression is relatively simple: the difference quantity is extracted by multiplying each compressed value by a multiplier. The multiplier may change from sample to sample; for example, the multiplier may increase after it has encountered two consecutive compressed values at maximum value. Each difference quantity is then added to the previous output value to provide a decompressed signal. Due to the lack of predictors, adaptive delta modulation facilitates simpler decompression hardware than ADPCM; however, this technique results in poor high-frequency response.

In general, most conventional compression techniques require relatively complex decompression schemes and expensive hardware.

SUMMARY OF THE INVENTION

In accordance with the present invention, there is provided a digital compression and decompression system and method using scaled quantization of variable-sized packets of difference samples.

The method of the present invention is as follows. The first source sample is output unchanged. Difference samples are generated for each subsequent source sample; each difference sample represents the difference between the value of the corresponding source sample and the previous source sample. The set of difference samples is then subdivided into packets.

If desired, the size of each packets may be variable. Boundaries between packets may be moved so that those packets containing relatively low-magnitude difference samples expand while packets containing higher-magnitude difference samples shrink. This process may lead to higher-quality compression.

A scale value is determined for each packet. Each difference sample may then be represented by a scaled sample, which is simply the difference sample divided by the scale value of the packet. To minimize decompression error, a "practical" difference sample may be used, which is derived by simulating the operation of the decompression system.

If any of the scaled samples exceed the maximum permitted by the system, scale values may be adjusted and scaled samples regenerated. Scaled samples and scale values are then output as a compressed signal.

Decompression of the compressed signal is performed as follows. For the first sample, the decompressed sample is equal to the compressed sample. For subsequent samples, the decompressed sample is determined according to the equation: Decompressed sample(N)=Decompressed sample(N−1)+(scaled sample) * (scale value of the packet).

The system and method of the present invention provide digital audio and video compression and decompression in a manner that facilitates inexpensive decompression by simple hardware. By providing for variable packet sizes, error introduced by scaled quantization is minimized. Packets with lower-magnitude samples are permitted to expand by including neighboring low-magnitude samples. Thus, the lower scale value required by high-magnitude samples does not unduly reduce the resolution of nearby low-magnitude samples.

DESCRIPTION OF THE PREFERRED EMBODIMENT

For illustrative purposes, the following description refers to single-channel (monaural) audio source data. The technique described may be applied to stereo audio, multichannel audio, and/or video data.

Definitions

Please note the following definitions of terms used in this application:

Boundary: A conceptual demarcation indicating the beginning of a packet.

Boundary differential: The difference between the difference amplitudes of the packets adjacent to a boundary.

Difference amplitude (of a packet): The largest absolute difference sample in a particular packet.

Difference sample: The difference between a source sample and the immediately preceding source sample.

Maximum scaled sample value: The maximum permissible value for all scaled samples in the signal, or for all scaled samples within a particular packet or sector. A function of the word length (number of bits) available to store scaled samples.

Packet: A variable-sized contiguous group of samples (usually difference samples).

Practical difference sample: The difference between a source sample and its reference decompressed sample. Approximates the corresponding difference sample.

Reference sample: A sample derived from the reference source sample by simulated decompression.

Reference source sample: The source sample immediately preceding the current source sample.

Scaled sample: A sample that represents a difference sample (or practical difference sample) divided by the appropriate scale value. This is output as the compressed sample.

Scale value: A multiplier associated with a packet, indicating the amount by which to multiply the scaled samples in order to obtain the decompressed sample.

Sector: A contiguous block of samples corresponding to the size of a block of physical storage. In the preferred embodiment, a sector contains 588 samples at a 44.1 kHz sampling rate. A sector contains a plurality of packets.

Source sample: A digital sample to be compressed.

Tolerance value: A maximum value by which the difference amplitude of an expanding packet may be allowed to increase.

Apparatus

Figure 1A:
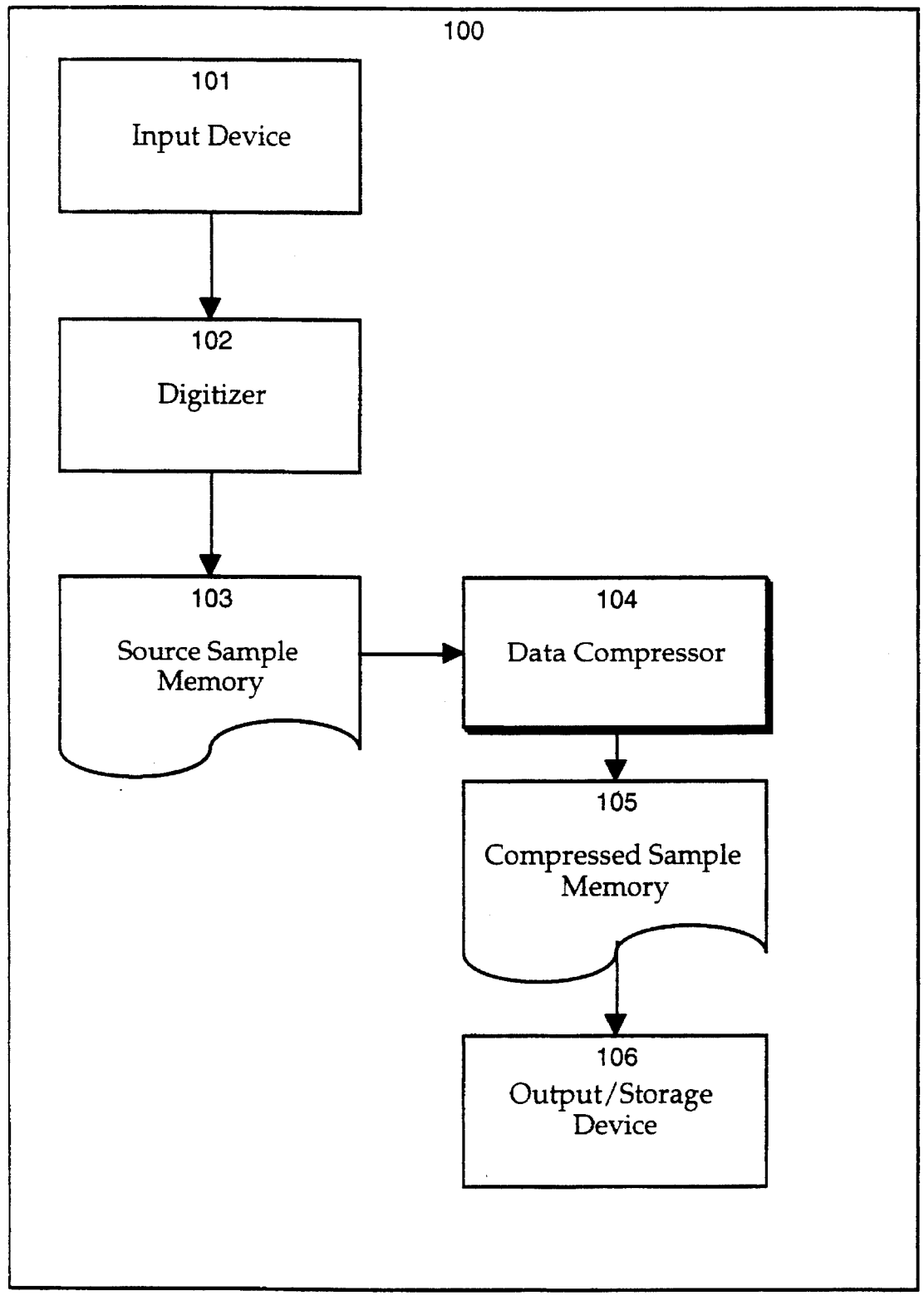
FIG. 1A is a block diagram of apparatus according to one embodiment of the present invention.

Referring now to FIG. 1A, there is shown a functional block diagram of apparatus 100 according to one embodiment of the present invention. In the preferred embodiment, data compressor 104 performs the steps of the method. Data compressor 104 may be implemented by a computer running software instructions, or it may be implemented as a hardware device, as later described herein. Input device 101 provides source input, and may be a microphone or other audio input device, video camera or other video input device, or an interface to some other data source (not shown). Digitizer 102 converts source input into digital form in a conventional manner. If source input is already in digital form, digitizer 102 may be omitted. Source sample memory 103, which may be conventional random-access memory (RAM), stores the digital source input. Data compressor 104 performs the steps of the present invention to compress the data stored in memory 103. The compressed data are placed in compressed sample memory 105 and are then transferred to output/storage device 106, which may be a CD-ROM or similar medium.

Figure 1B:
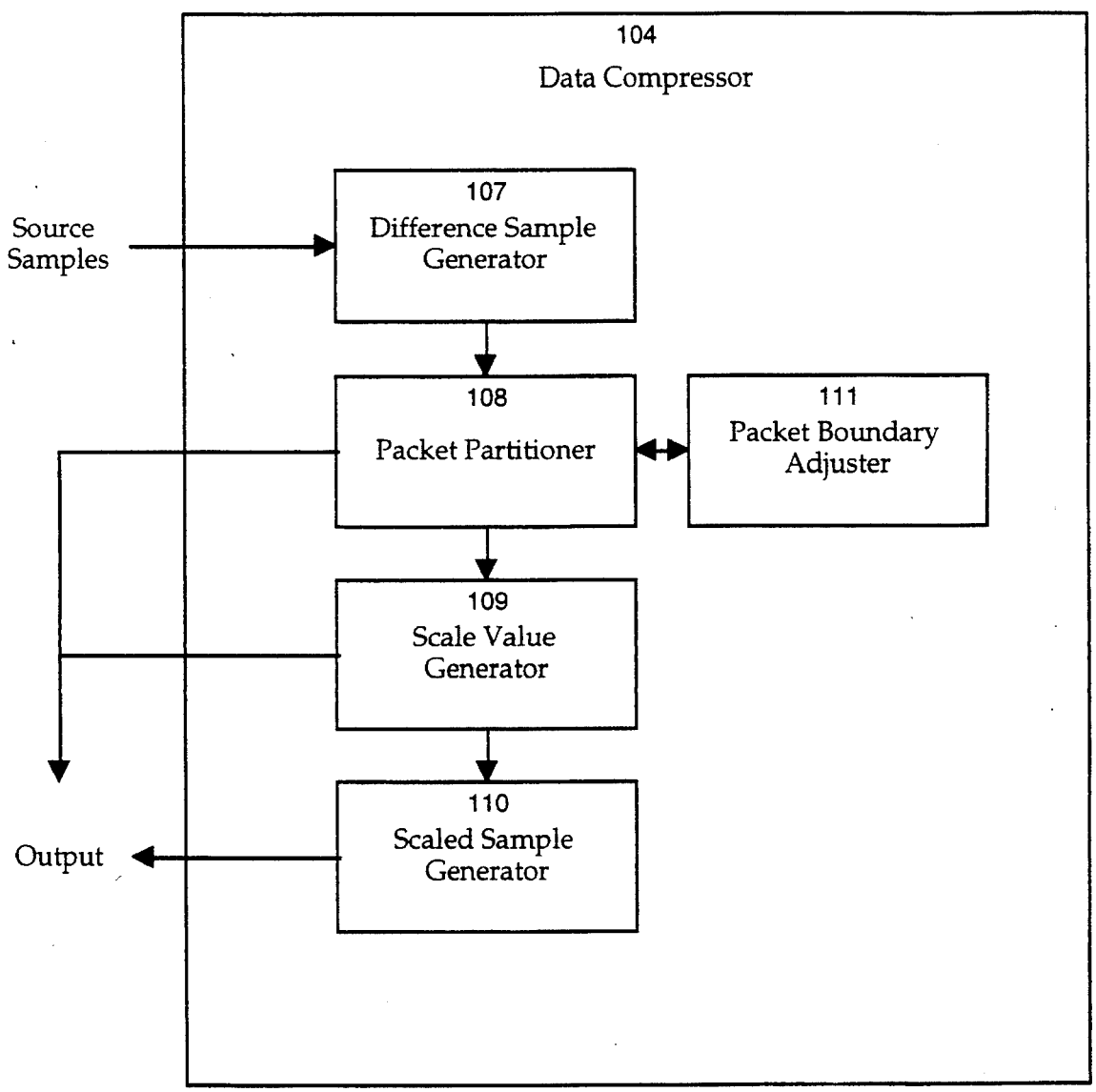
FIG. 1B is a block diagram of a data compressor according to the present invention.

Referring now to FIG. 1B, there is shown a block diagram of the functional operation of data compressor 104. The various components of data compressor 104 may be implemented in software, as in the preferred embodiment, or they may be implemented in hardware. Source samples from source sample memory 103 are fed to a difference sample generator 107, which produces difference samples as described below in connection with step 204 of FIG. 2. Packet partitioner 108 partitions the difference samples into a series of packets as described below in connection with step 205 of FIG. 2. Packet boundary adjuster 111 adjusts the sizes of the packets by moving boundaries as described below in connection with FIGS. 3 and 4. Scale value generator 109 determines a scale value for each packet as described below in connection with step 208 of FIG. 2. Scaled sample generator 110 generates a scaled sample for each difference sample as described below in connection with FIG. 5. The results from components 107, 109 and 110 are output as the compressed signal. The operation of the components shown in FIGS. 1A and 1B is more fully described below, in connection with FIGS. 2 through 10C.

Compression Method

Figure 2:
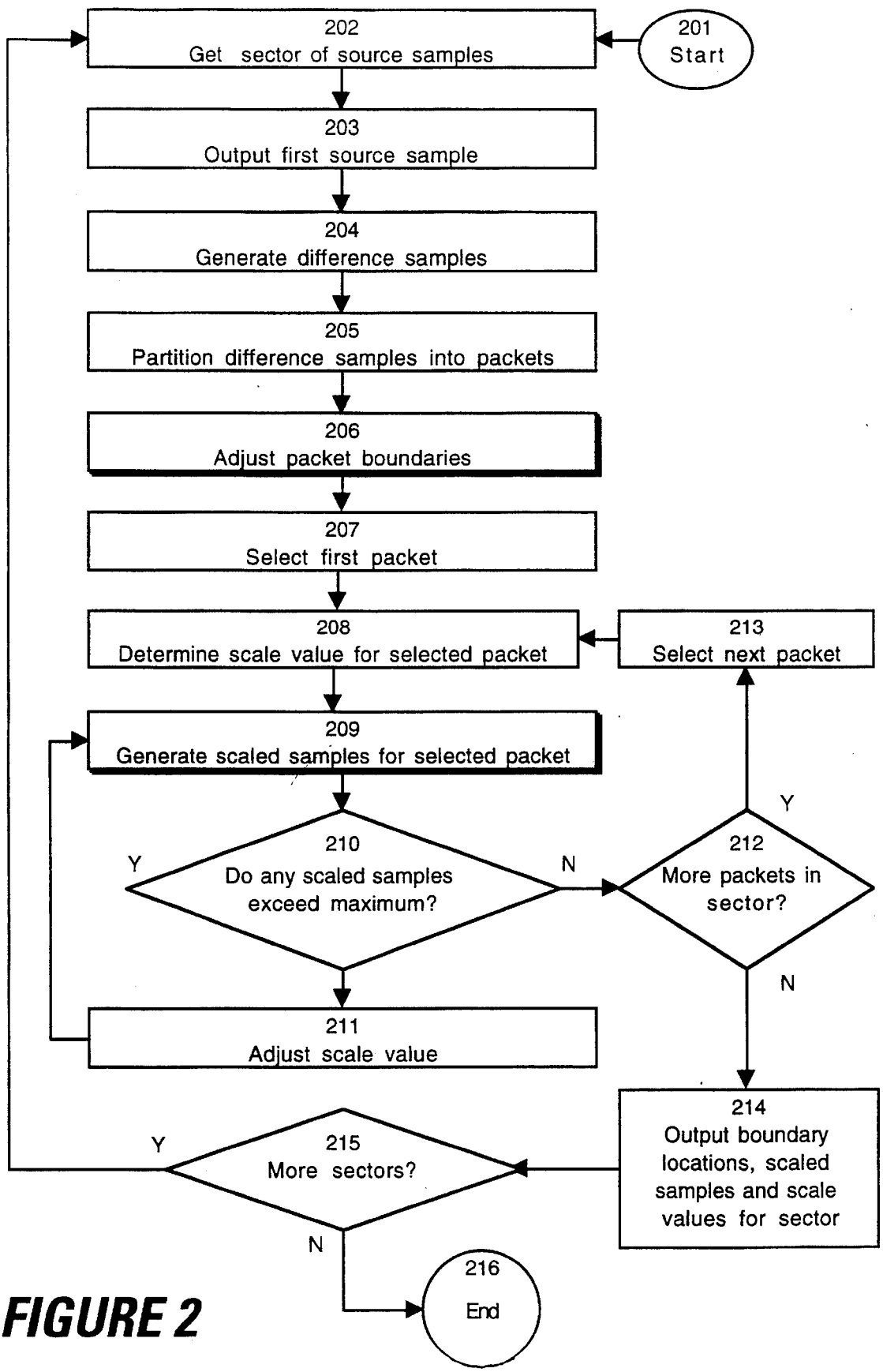
FIG. 2 is a flowchart showing the compression method of the present invention.
Figure 6A:
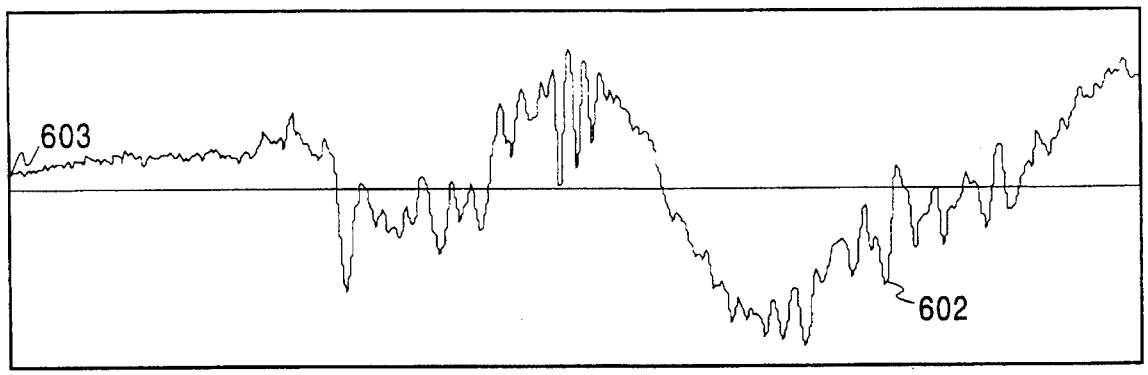
FIG. 6A is a graph showing a sector containing source samples.

Referring now to FIG. 2, there is shown a flowchart of a preferred embodiment of the present invention. First a sector of source samples is obtained 202. In the preferred embodiment, a sector represents 588 16-bit source samples, each sample consisting of a 2's complement number ranging from −32,768 to 32,767. In other embodiments, a sector may represent all the source samples or any subset of source samples, usually corresponding to a physical storage block. Referring also to FIG. 6A, there is shown a sector 601 containing source samples 602.

The first source sample 603 in sector 601 is output unchanged 203. Sample 603 will be used as a starting point during decompression. As will be explained in more detail below, the decompressor decompresses all samples by reference to the first sample in a sector. A starting point is provided at the beginning of each sector 601 so that decompression can begin at the start of any sector. The starting value also resets the decompressor to a known state. This is useful to halt propagation of incorrect data after a hardware error.

Figure 6B:
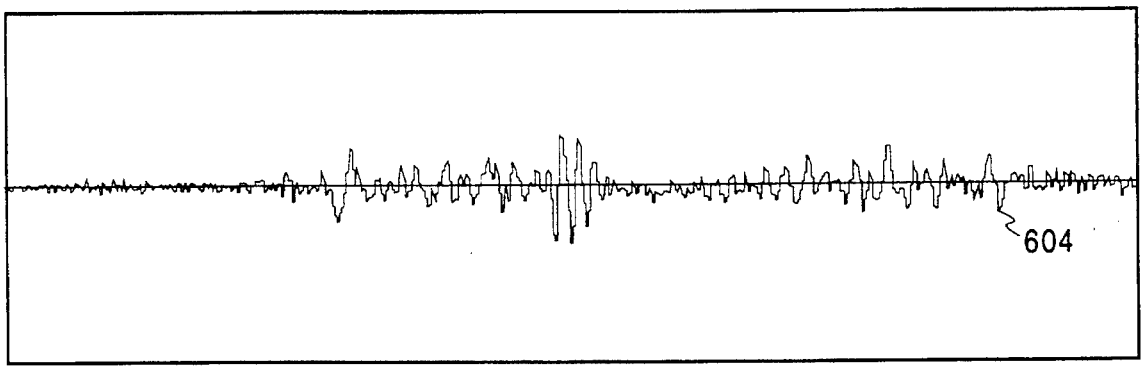
FIG. 6B is a graph showing a sector containing difference samples.

Next, difference samples are generated 204 for all source samples 602 except the first source sample 603. Referring also to FIG. 6B, there is shown sector 601 containing difference samples 604. Each difference sample 604 is generated by subtracting the previous source sample 602 from the current source sample 602. This technique is known as "differential pulse code modulation". Difference samples 604 are stored as 17-bit 2's-complement numbers, since they may range from −65,535 to +65,535 (representing the theoretical maximum difference from one source sample 602 to the next).

Figure 7A:
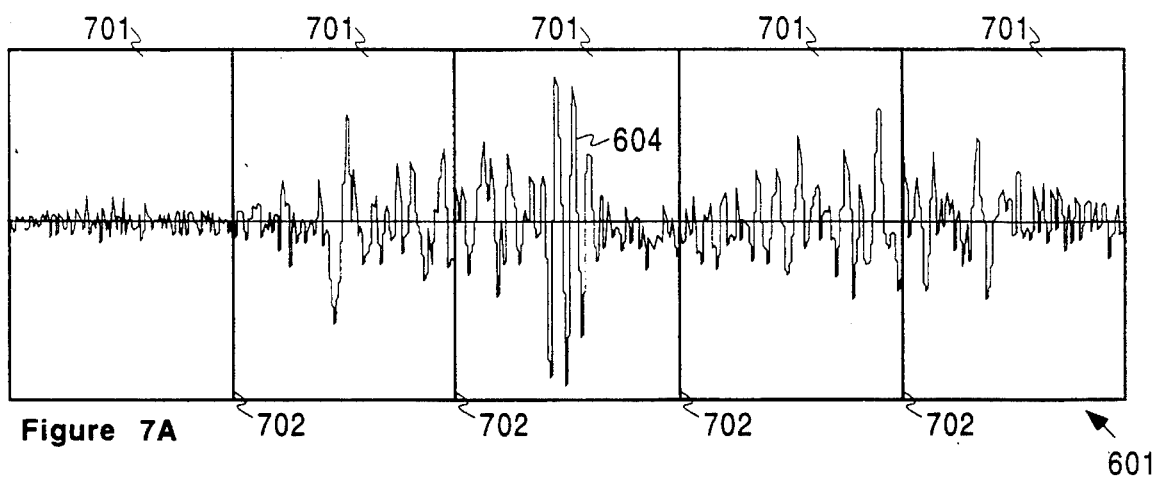
FIG. 7A is a graph showing a sector containing packets of equal size.

The set of difference samples is then partitioned 205 into packets. Referring now to FIG. 7A, there is shown an example of partitioning. Sector 601, containing difference samples 604, is shown subdivided into five equally-sized packets 701, with packet boundaries 702 defining the beginning points of all packets 701 except the first. The number of packets 701 may be specified before compression, or may be algorithmically determined by iteration based on an error function. In the preferred embodiment, the number of packets 701 is predetermined and fixed at one of two values, namely 5 or 62.

Figure 7B:
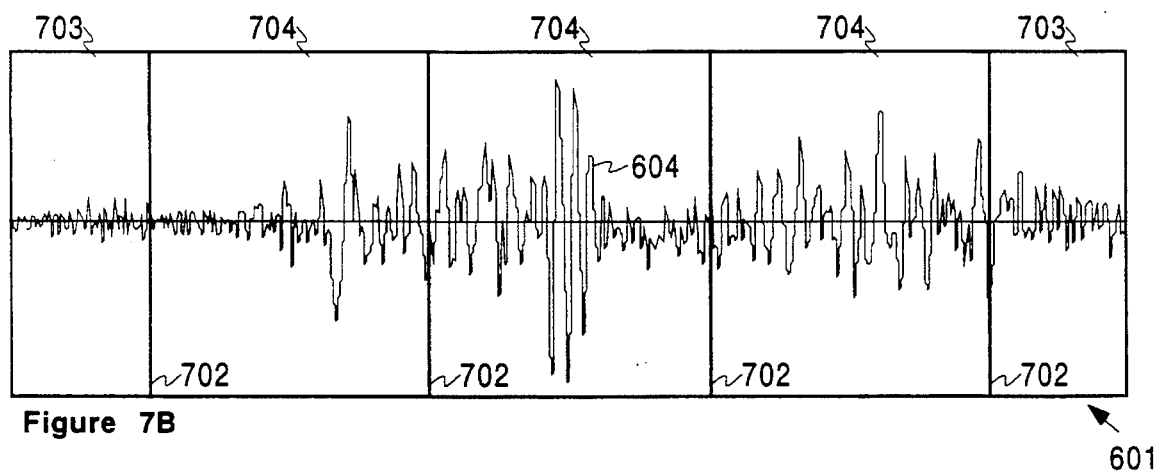
FIG. 7B is a graph showing a sector containing packets of unequal size.

Packets 701 may be of equal size, as shown in FIG. 7A, or they may be of different sizes. Referring now to FIG. 7B, there is shown sector 601 with three large packets 704 and two smaller packets 703. The rationale for making the first and last packets 703 smaller is that these packets are each adjacent to only one movable boundary, while packets 704 are each adjacent to two movable boundaries. It has been found that higher-quality results may be obtained when those packets that are less "flexible" (adjacent to fewer movable boundaries) are given a smaller initial size. Thus, in the preferred embodiment, the first and last packets 703 are initially half the size of other packets 704. Alternatively, other relative sizes could be used. Furthermore, the decision as to whether to provide equal or unequal initial packet sizes could be made algorithmically on a sector-by-sector basis by performing the entire compression process both ways, comparing resulting errors, and selecting the initial packet sizes that produce the least error.

If desired, packet boundaries 702 may be adjusted 206. The purpose of adjusting boundaries 702 is to increase resolution of the signal by selectively transferring samples from low-resolution packets to high-resolution packets. The resolution of a packet depends upon its scale value, which in turn depends upon its difference amplitude. Packets having higher difference amplitudes have higher scale values and therefore have lower resolution. Thus it is generally beneficial to transfer a sample from a packet having a high difference amplitude to a packet having a low difference amplitude. This is done by expanding packets having low difference amplitude so that they include neighboring samples. Difference amplitudes of expanding packets may be permitted to increase, if desired, to a limit specified by a tolerance value. The process of adjusting packet boundaries is described in more detail below, with reference to FIGS. 3, 4, 8, 9A, 9B, 9C, 10A, 1013, and 10C.

Once packet boundaries have been adjusted, the first packet 701 is selected 207. A scale value is then determined 208 for the selected packet. The scale value is a multiplier indicating the amount by which to multiply scaled samples during decompression. Thus, it is the minimum value which allows every difference sample in the packet to be represented by an N-bit signed magnitude scaled sample. In the preferred embodiment, scaled sample word length is 5 bits (a 1-bit sign and a 4-bit magnitude), and scale value is a 15-bit floating point positive value with a 3-bit exponent and a 12-bit mantissa, the mantissa containing a 6-bit whole value and a 6-bit fractional value. With a 15-bit scale value having a 12-bit mantissa as in the preferred embodiment, the scale value can be multiplied by the 5-bit scaled sample to produce a 17-bit decompressed difference sample. Other sizes of scaled samples and scale values may be used.

Fractional bits are beneficial because they increase the resolution for small values. For example, suppose the difference samples in a packet range from −15 to +15. A scale value of 1 allows scaled samples ranging from −15 to +15 to represent all the difference samples. Now, suppose the difference samples range from −16 to +16. Then, the scale value should be 16/15, or approximately 1.0667. If no fractional bits are available, a scale value of 2 must be used. In that case, scaled samples ranging from −8 to +8 would represent all the difference samples, and all other scaled sample states (−15 to −9, +9 to +15) are wasted. Fractional bits permit a scale value approximating 1.0667 to be used so that fewer states are wasted.

Figure 8:
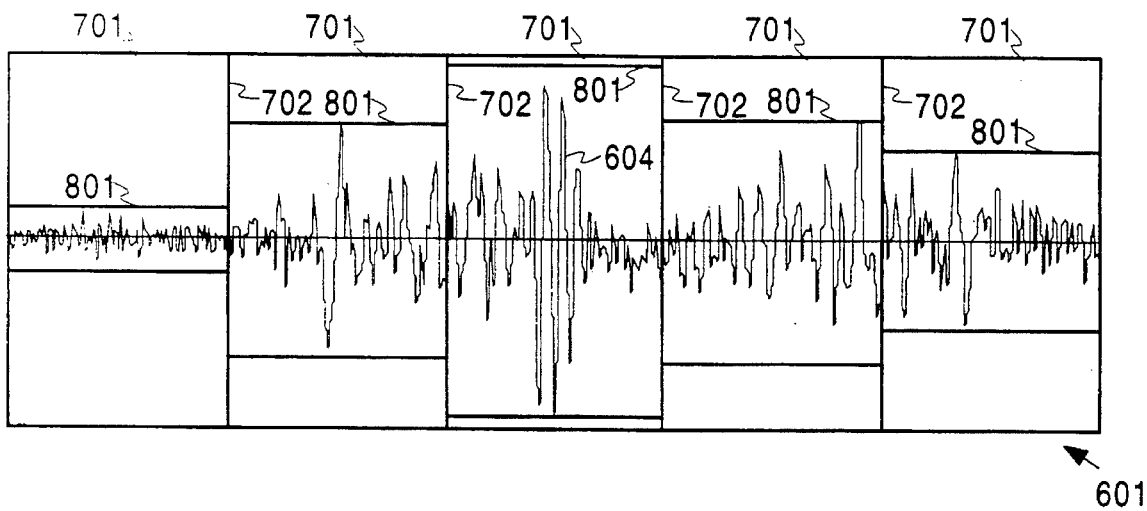
FIG. 8 is a graph showing a sector illustrating difference amplitudes of packets.

The scale value for a packet is determined using the difference amplitude for the packet. As shown in FIG. 8, the difference amplitude 801 for a packet is equal to the largest absolute difference sample in the packet. This difference amplitude 801 is divided by the absolute value of the largest possible scaled sample to obtain the scale value for the sample. During decompression, maximum error for decompressed difference samples will be equal to one-half of the scale value.

Figure 5:
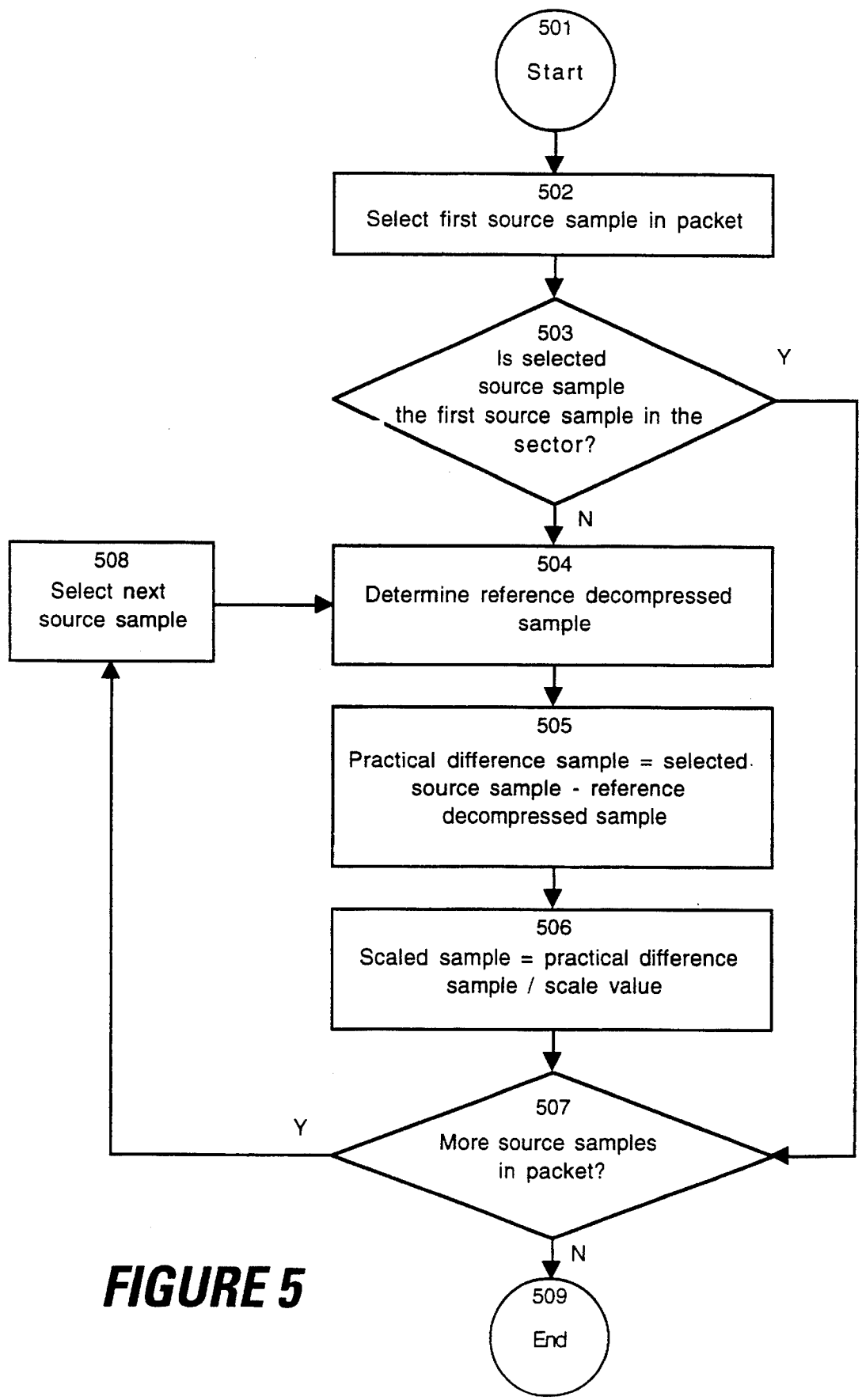
FIG. 5 is a flowchart showing a method of generating scaled samples according to the present invention.

Once a scale value has been determined, scaled samples are generated 209 for all samples in the selected packet except the first sample in the sector. Referring also to FIG. 5, there is shown a flowchart of the method of generating scaled samples according to the preferred embodiment. The first source sample in the packet is selected 502. If the selected sample is the first sample in the sector, the system skips to step 507. If not, it determines 504 a reference sample as follows. The reference source sample is the source sample immediately preceding the selected sample. A reference sample is determined by simulating decompression of the reference source sample. Thus, if the reference source sample is the first source sample in the sector, the reference decompressed sample is equal to the reference source sample. If the reference source sample is any other sample, the reference decompressed sample is determined by the formula:

$$r(N)=r(N-1)+s(N)*v \qquad \text{(Eq. 1)}$$

where:

r(N) is the reference decompressed sample;

r(N−1) is the reference decompressed sample immediately preceding the reference source sample;

s(N) is the scaled sample corresponding to the reference source sample; and v is the scale value of the corresponding packet.

This formula simulates operation of a decompressor. During compression, the formula is applied with a precision that models the precision of the decompressor.

Once a reference sample has been determined, a practical difference sample is generated 505 by subtracting the reference sample from the selected source sample. A scaled sample is generated 506 by dividing the practical difference sample by the scale value of the packet. The system then checks 507 whether there are more source samples in the packet. If so, the next source sample is selected and steps 504 through 507 are repeated.

Empirically, it has been found that the distribution of scaled samples is skewed towards small values. If desired, a set of scaled sample states can be translated into non-linear scaled sample values using a lookup table. For example, a 4-bit scaled sample may have any of the following states: 0, 1, 2, 3, 4, 5, 6, 7, 8, 9, 10, 11, 12, 13, 14, 15. A lookup table may be provided to map these states to a non-linear set of scale sample values, such as: 0, 0.5, 1.0, 1.5, 2, 3, 4, 5, 6, 7, 8, 9, 10, 11, 13, 15. In the preferred embodiment, several lookup tables may be defined, including both linear and nonlinear mappings. For each sector, scaled sample states are generated using each lookup table and an error metric for each lookup table is determined. The lookup table having the lowest error metric is selected. A code specifying the selected table is placed at the beginning of the sector. Alternatively, this determination could be made on a packet-by-packet basis, with a code appearing at the beginning of each packet.

The error metric can be obtained using conventional error measurement technique. One possible error metric is the sum of the absolute value of the difference between each source sample and its corresponding decompressed sample. Another is the mean square error, which is the average of each difference between a source sample and its corresponding decompressed sample.

It is possible that the scaled sample determined by the above technique will exceed the maximum permissible scaled sample that may be stored given the number of bits available. This phenomenon, called slope overload, may occur when the practical difference sample exceeds the difference amplitude of the packet. It results from the potential error in the reference sample of up to one-half of the scale value, as described above. The error may be exacerbated when the reference sample is the last sample in a packet with a large scale value and the scaled sample being generated is the first scaled sample in a packet with a smaller scale value.

Referring again to FIG. 2, the system checks 210 whether any scaled samples in the selected packet 701 exceed the maximum. If so, the scale value for the packet is adjusted 211 upwards and scaled samples are regenerated 209. Steps 209 through 211 are repeated until no scaled samples exceed the maximum. Then, if more packets 701 remain 212 in the sector, the next packet 701 is selected 213 and steps 208 through 213 are repeated. If no more packets 701 remain, boundary locations, scaled samples, and scale values for the sector are output 214. If more sectors remain 215, steps 202 through 215 are repeated.

Figure 3:
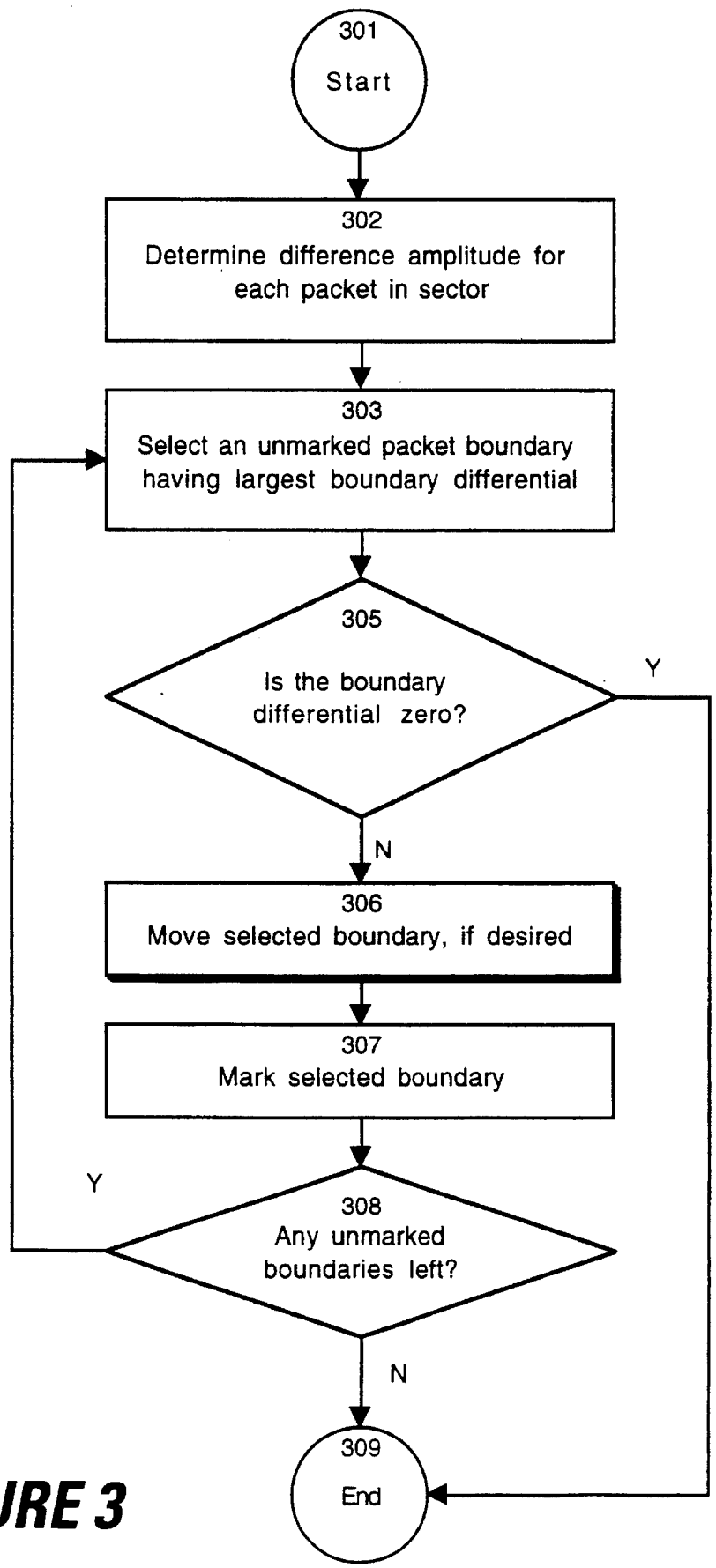
FIG. 3 is a flowchart showing a method of adjusting packet boundaries according to the present invention.

Referring now to FIG. 3, the process of adjusting packet boundaries 702 is shown. First, a difference amplitude is determined 302 for each packet 701. Referring also to FIG. 8, there is shown sector 601 partitioned into five packets 701. Difference amplitude 801 for each packet 701 is equal to the largest absolute difference sample 604 within the packet 701. An unmarked packet boundary 702 is selected 303. In the preferred embodiment, the boundary 702 with the largest boundary differential is selected, where the boundary differential is defined as the difference between the difference amplitudes of the packets adjacent to a boundary.

Once a boundary 702 has been selected, the system checks whether the boundary differential for the selected boundary 702 is zero (i.e., the difference amplitudes 801 on either side are equal). If so, the system exits 309. If not, the system first moves 306 the selected boundary 702 to expand the packet 701 having the smaller difference amplitude 801. The boundary movement process is described in more detail below, with reference to FIG. 4. The selected boundary 701 is then marked 307 as unmovable. If any unmarked boundaries 701 remain 308, steps 303 through 308 are repeated.

Figure 9A:
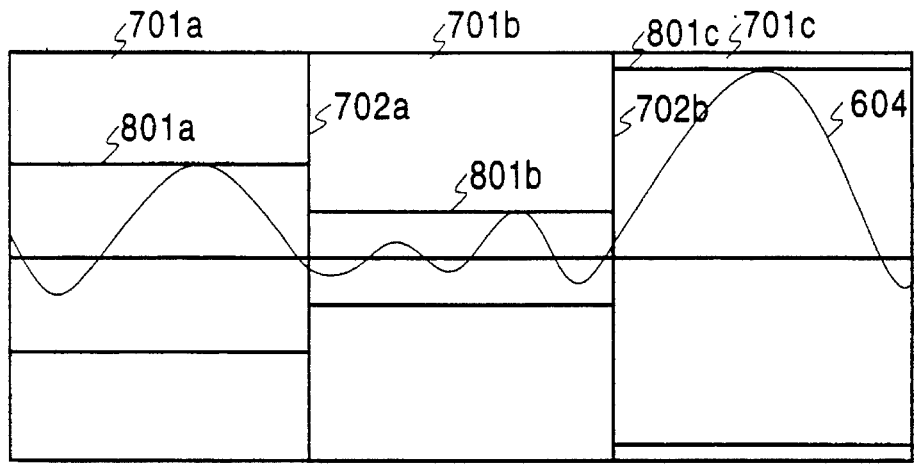
FIG. 9A is a graph showing a series of packets prior to packet boundary adjustment.
Figure 9B:
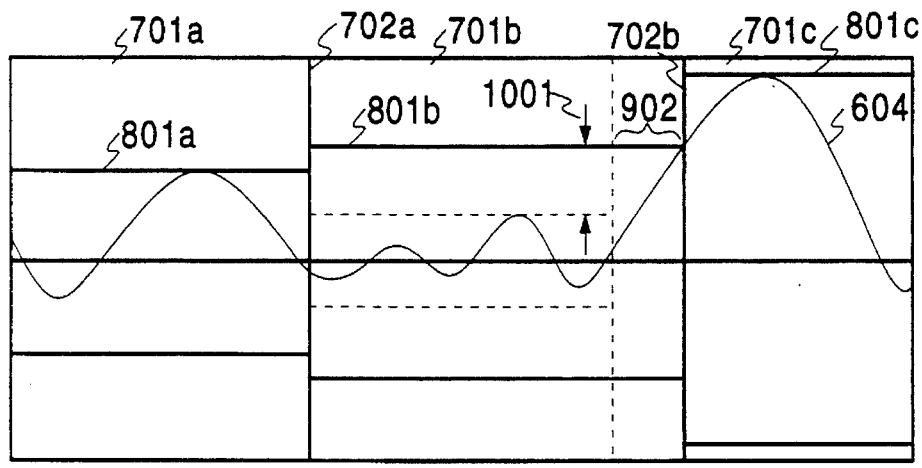
FIG. 9B is graph showing the series of packets after adjustment of the boundary having the highest boundary differential.
Figure 9C:
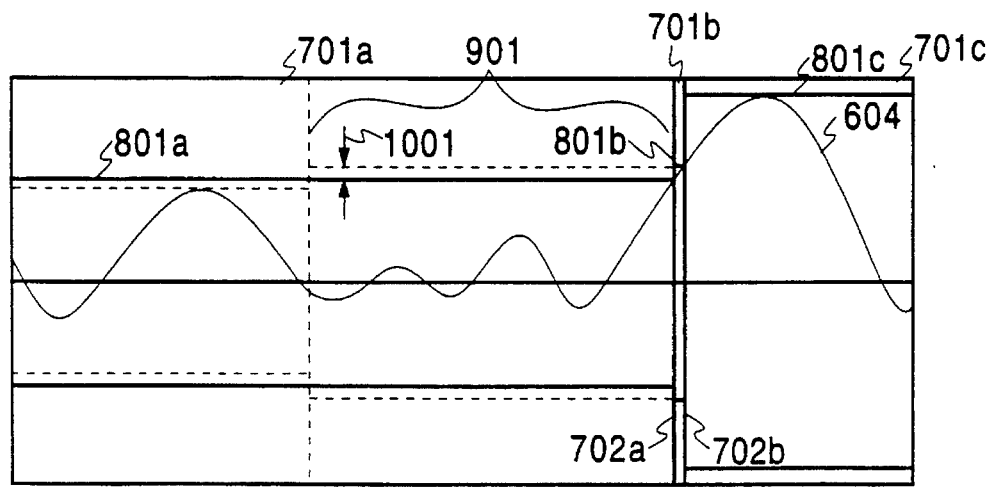
FIG. 9C is a graph showing the series of packets after both boundaries have been adjusted in order of highest to lowest boundary differentials.
Figure 10A:
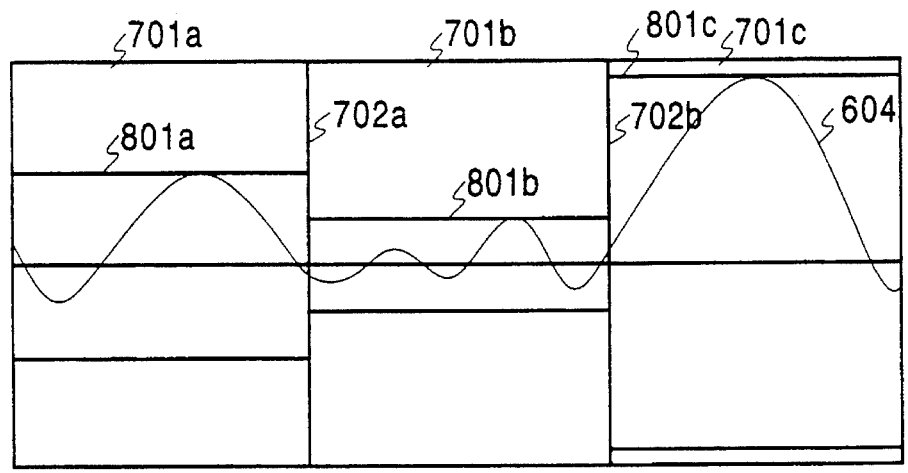
FIG. 10A is a graph showing a series of packets prior to packet boundary adjustment.
Figure 10B:
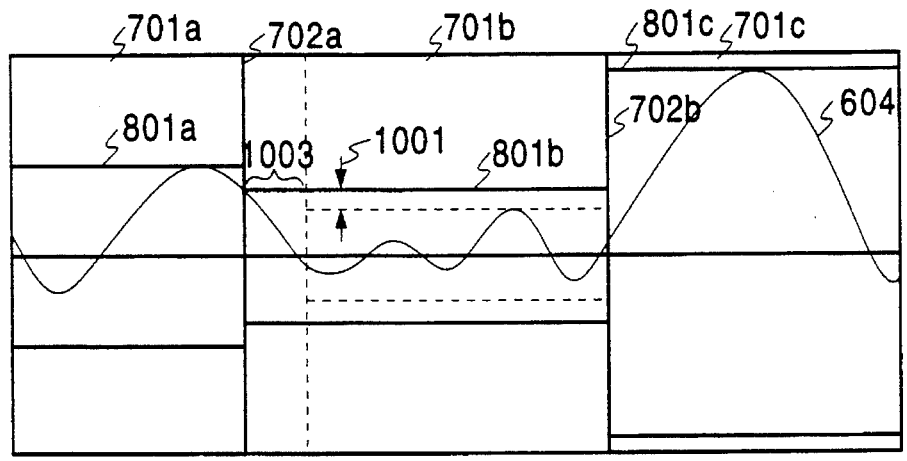
FIG. 10B is a graph showing the series of packets after adjustment of the first boundary.
Figure 10C:
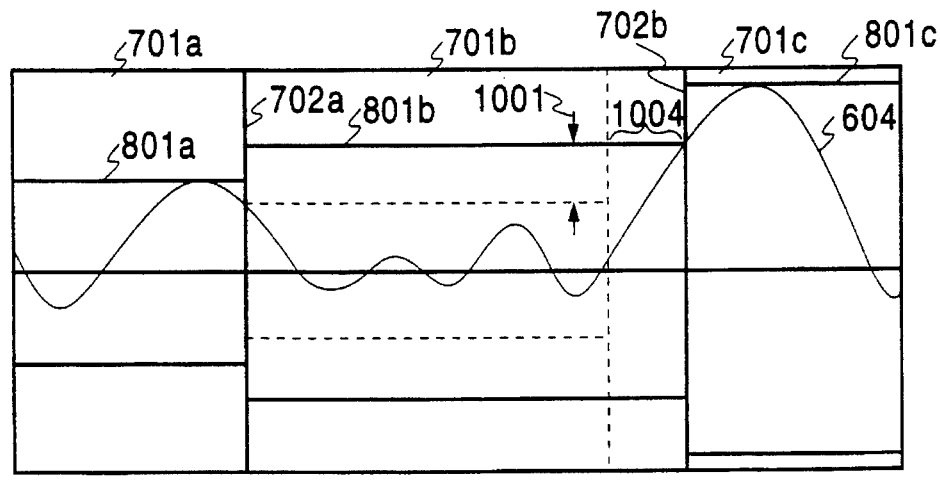
FIG. 10C is a graph showing the series of packets after both boundaries have been adjusted in sequential order.

The rationale for, in step 303, selecting the boundary 702 having the largest boundary differential is that, if any other order is used, there is a possibility that a sample may move from a lower-difference-amplitude (high resolution) packet to a higher-difference-amplitude (low resolution) packet. This would serve to decrease rather than increase resolution. This phenomenon is shown in FIGS. 10A, 10B, and 10C. Packet 701b starts out with the smallest difference amplitude 801b. If boundary 702a is moved first, packet 701b expands to include samples 1003 that formerly were in packet 701a. Then, when boundary 702b is moved, packet 701b expands to include samples 1004 that formerly were in packet 701c. Difference amplitude 801b of packet 701b increases and is now larger than difference amplitude 801a of packet 701a. Therefore, samples 1003 will suffer from decreased resolution, since they have moved from a lower-difference-amplitude packet 701a to a higher-difference-amplitude packet 701b. If, as shown in FIGS. 9A, 9B, and 9C, boundary 702b is moved first, no samples move from packet 701a to packet 701b. In fact, since packet 701a has a smaller difference amplitude than packet 701b after boundary 702b is moved, packet 701a expands to include samples 901 from packet 702b. Thus, no sample moves to a packet having higher difference amplitude than the packet in which it started.

Although it is beneficial to select the boundary 702 having the largest boundary differential, other design considerations may dictate that boundaries 702 be moved sequentially or in some other order. In particular, the above-described problem will not occur if the tolerance value is zero, as discussed below.

Figure 4:
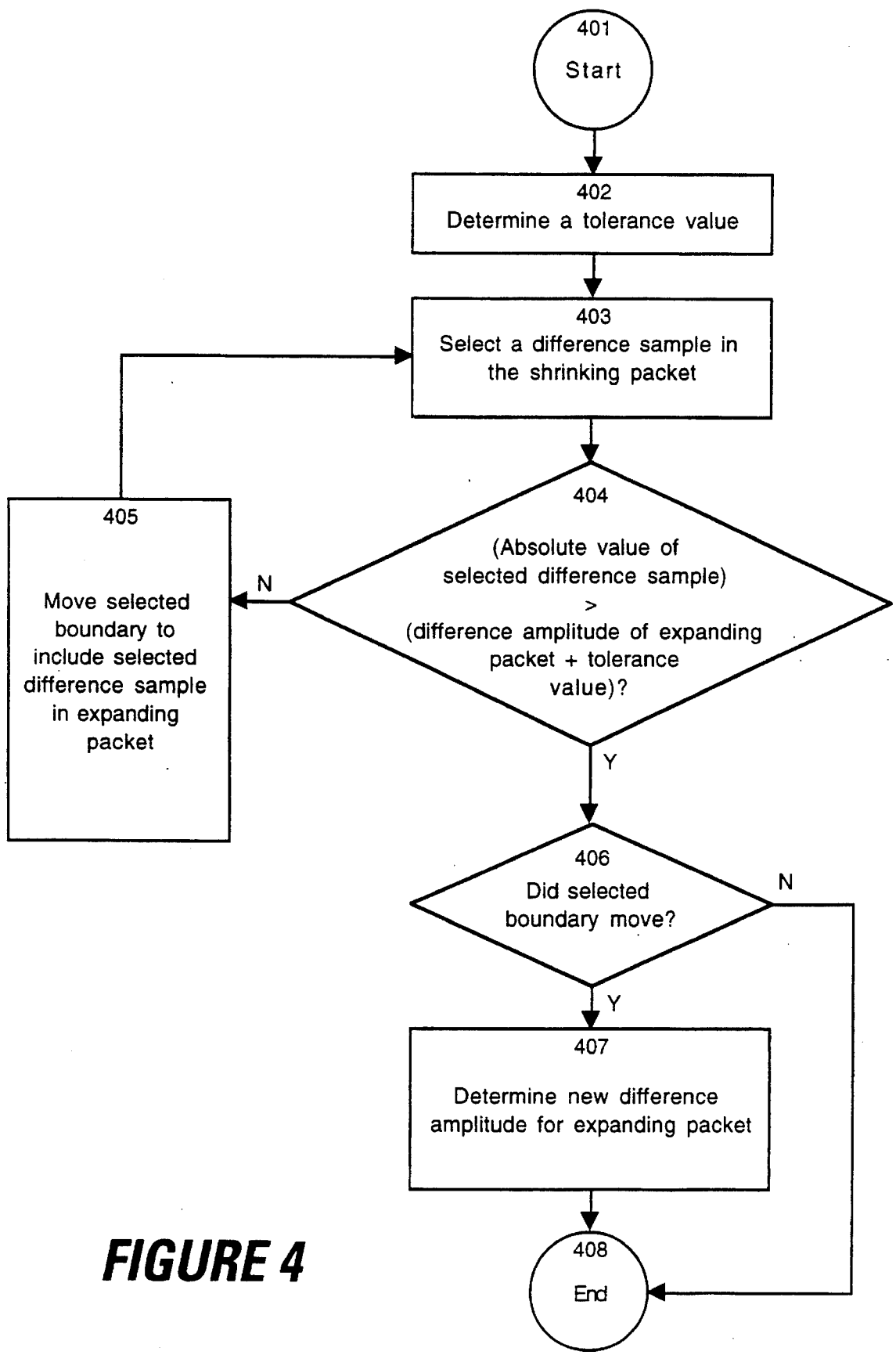
FIG. 4 is a flowchart showing a method of moving a boundary according to the present invention.

Referring also to FIG. 4, a flowchart of the boundary movement process is shown. First, a tolerance value is determined 402. This tolerance value represents the maximum permissible increase in a packet's difference amplitude that may result from packet expansion. Tolerance value may be set to zero, if desired, in which case packet expansion will only occur if it would not result in any increase in a packet's difference amplitude. In the preferred embodiment, tolerance value is predefined, and is expressed as a fraction of the boundary differential. Other representations and methods of defining the tolerance value may be used. A difference sample adjacent to the selected boundary in the shrinking packet is selected 403. The absolute value of the selected difference sample is compared 404 with the sum of the difference amplitude of the expanding packet plus the tolerance value. If the absolute value does not exceed the sum, the selected boundary is moved 405 so that the expanding packet now includes the selected difference sample, and steps 403 to 405 are repeated. If the absolute value does exceed the sum, the selected boundary is not moved. Thus, the boundary selectively moves repeatedly until the increase in difference amplitude of the expanding packet would exceed the tolerance value. Once this point is reached, the system checks to determine if the selected boundary moved 406, and if so, a new difference amplitude is determined 407 for the packet that expanded.

An example of boundary movement is shown in FIGS. 9A, 9B, and 9C. FIG. 9A shows sector 601 containing three packets 701a, 701b, and 701c. Boundary 702a lies between packets 701a and 701b, while boundary 702b lies between packets 701b and 701c. Each packet 701a, 701b, and 701c has a corresponding difference amplitude 801a, 801b, and 801c, respectively. In this example, the largest boundary differential occurs across boundary 702b, so this boundary is moved first. Referring also to FIG. 9B, tolerance value 1001 is shown. Boundary 702b is moved to the right until any further movement would cause the increase in difference amplitude 801b of packet 701b to exceed tolerance value 1001. As a result, difference samples 902 are now part of packet 701b. Referring also to FIG. 9C, boundary 702a is moved to the right since difference amplitude 801a of packet 701a is now smaller than difference amplitude 801b of packet 701b. Boundary 702a is moved until the difference amplitude 801a of packet 701a has increased by an amount equal to the tolerance value 1001. It should be noted that tolerance value 1001 is expressed as a percentage of the boundary differentials, and therefore the absolute magnitude of tolerance value 1001 is not the same between FIGS. 9B and 9C. Once boundary 702a has moved, difference samples 901 are now part of packet 701a.

Data Format

Once compression is complete, the output signal for each sector includes the following data, in the preferred embodiment:

a 16-bit 2's complement initial value;

a 4-bit lookup table selector (if desired); and a stream of 5-bit "tidbits" representing scaled samples, packet boundaries, and scale values.

Since scaled samples are signed magnitude values ranging from −15 to +15, the unused state of "−0" is used as an escape character to indicate a packet boundary. Thus, packet boundaries are imbedded in the data stream. Each packet boundary is followed by three "tidbits" of scale value (3 bits of exponent and 12 bits of mantissa).

Decompressor

Figure 12:
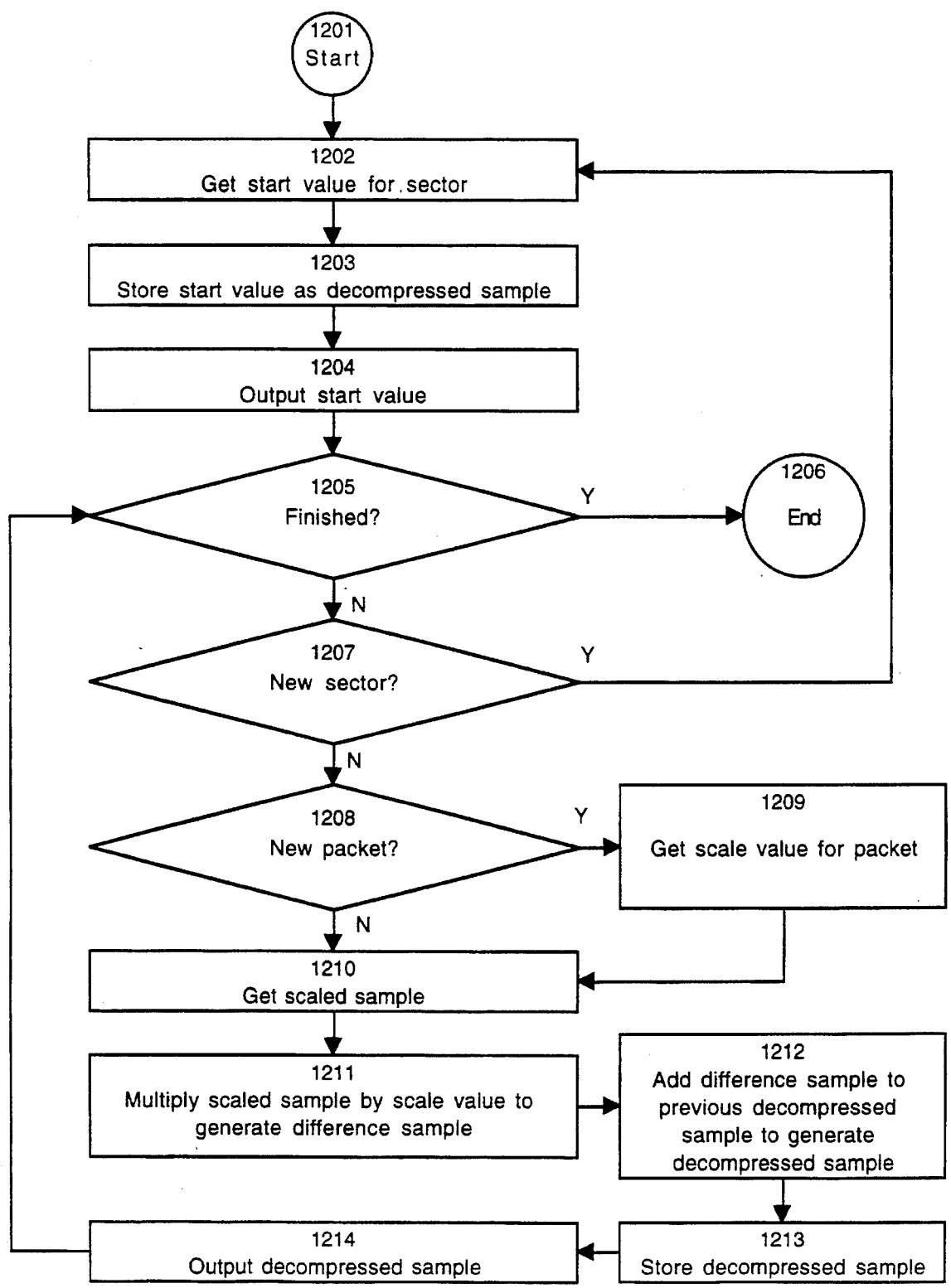
FIG. 12 is a flowchart showing the decompression process of the present invention.

Referring now to FIG. 12, there is shown a flowchart of the decompression process. A start value is obtained 1202 for the current sector. This start value is stored 1203 as a decompressed sample, and is output 1204. If there are no more samples 1205, the decompressor is done 1206. If a new sector begins, the decompressor returns to step 1202. If a new packet begins 1208, a scale value for the packet is obtained 1209. A scaled sample is then obtained 1210. The scaled sample is multiplied 1211 by the scale value to generate a difference sample. This difference sample is then added 1212 to the previous decompressed sample to generate a &compressed sample. The decompressed sample is stored 1213 and output 1214. Then the decompressor returns to step 1205.

Figure 11:
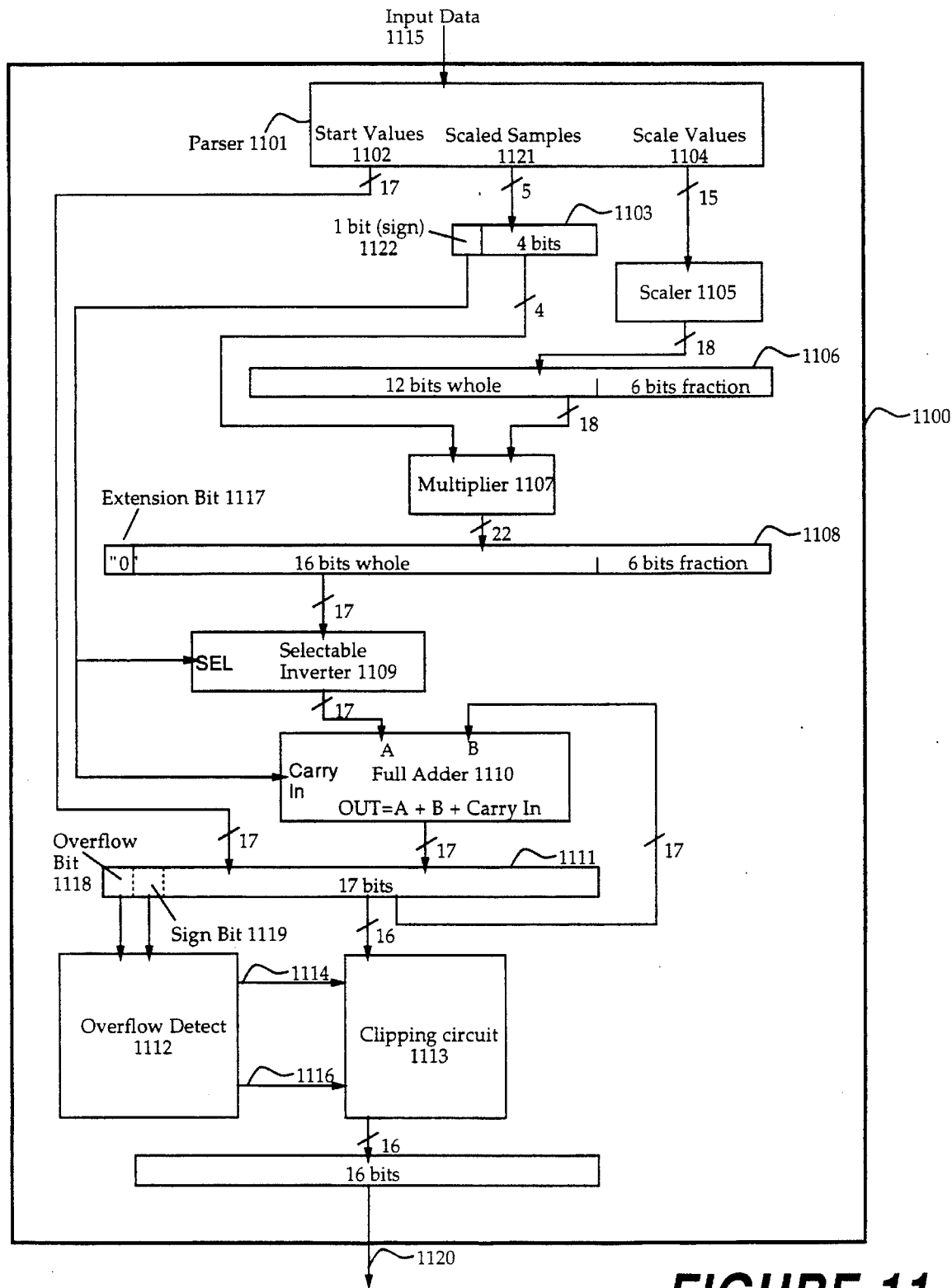
FIG. 11 is a block diagram of a decompressor according to the present invention.

Referring now to FIG. 11, there is shown a block diagram of a decompressor 1100 according to the present invention. In the preferred embodiment, decompressor 1100 is implemented in hardware, although the same functionality could be implemented in software.

A parser 1101 accepts input data 1115 and parses it into three components, including start values 1102, scale values 1104, and scaled samples 1121. Start values 1102 appear at the beginning of each sector. As described above, scale values 1104 are identified by the fact that they follow immediately after a packet boundary. Scale values 1104 are 15-bit floating point numbers consisting of a 3-bit exponent ranging from 0 to 6, and a 12-bit mantissa. The unshifted mantissa consists of 6 bits of whole value and 6 bits of fractional value. Scaled samples 1121 are in signed magnitude format, with a 1-bit sign and a 4-bit magnitude.

Parser 1101 sign-extends start value 1102 from 16 bits to 17 bits. The sign-extended start value, a 2's complement number, is placed in an unclipped result register 1111.

A scaler 1105 shifts the mantissa of scale value 1104 to the left by an amount equal to the exponent of scale value 1104. The result is placed in a scale value register 1106. The bits of scale value register 1106 that are not occupied by the mantissa are set to "0". Scale value register 1106 has 12 bits of whole value and 6 bits of fractional value.

Scaled sample 1121 is stored in a scaled sample register 1103 including a sign bit 1122. A multiplier 1107 multiplies the four-bit magnitude component of scaled sample 1121 by the contents of the 18-bit scale value register 1106 to yield a 22-bit result which is placed in a difference value register 1108. Multiplication is performed in a conventional manner by successive shifts and adds. An extension bit 1117 is added to the contents of difference value register 1108 as a 23rd, most significant bit. Difference value register 1108 has 17 bits of whole value and 6 bits of fractional value. The fractional part of register 1108 is retained for greater precision during multiplication, but is not used thereafter.

The whole part of the contents of difference value register 1108, including extension bit 1117, is either added to or subtracted from the contents in unclipped result register 1111. An add is performed if sign bit 1122 of scaled sample register 1103 is not set, or a subtract is performed if sign bit 1122 is set. Sign bit 1122 is fed to a selectable inverter 1109 and is also fed as a carry-in to a full adder 1110. If sign bit 1122 is not set, selectable inverter 1109 feeds the contents of difference value register 1108 into adder 1110, and adder 1110 adds this to the contents of unclipped result register 1111. If sign bit 1122 is set, selectable inverter 1109 feeds the inverse of the contents of difference value register 1108 into adder 1110, and adder's carry-in bit is set, so that a 2's complement inversion is performed, resulting in a subtraction. The result is placed in unclipped result register 1111.

The value in unclipped result register 1111 may exceed the 2's complement range for 16 bits (−32,768 to +32,767). This overflow condition is detected by comparing overflow bit 1118 to sign bit 1119. If they are the same, there is no overflow. If overflow bit 1118 is "0" and sign bit is "1", there is a positive overflow. If overflow bit 1118 is "1" and sign bit is "0", there is a negative overflow. An overflow detect circuit 1112 detects this overflow and transmits a positive overflow signal 1114 or a negative overflow signal 1116 as appropriate.

The low 16 bits of the contents of unclipped result register 1111 are transferred into a clipping circuit 1113. Clipping circuit 1113 transfers the 16 bits to a result register 1115 if there has been no overflow. If positive overflow signal 1114 is active, clipping circuit 1113 substitutes a maximum value (all bits set to "1" with the sign bit cleared). If negative overflow signal 1116 is active, clipping circuit 1113 substitutes a minimum value (all bits set to "0" with the sign bit set). These maximum and minimum values may be represented in hexadecimal as $7FFF and $8000, respectively. The contents of result register 1115 are then output as a decompressed signal 1120.

Figure 13:
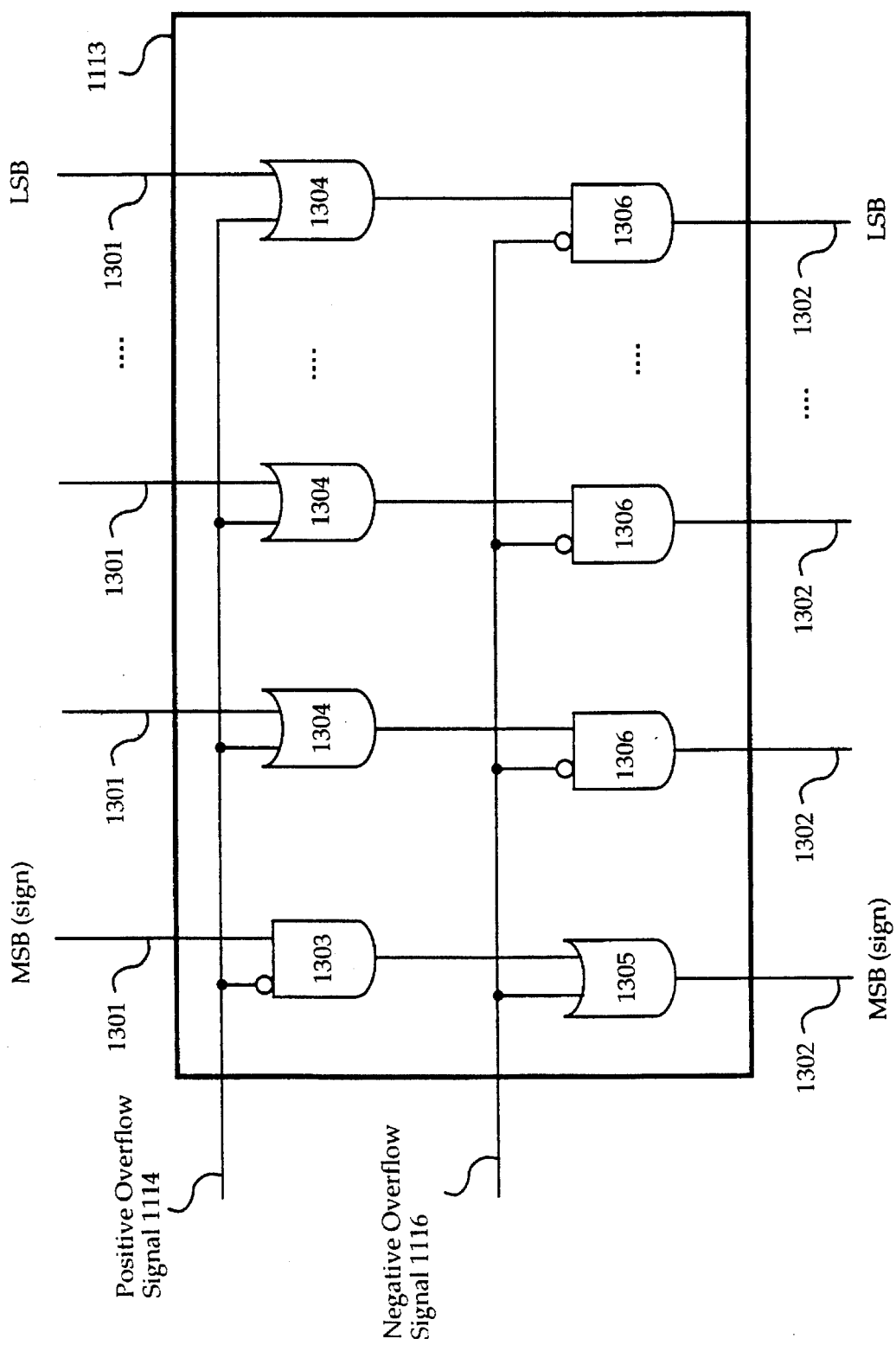
FIG. 13 is a block diagram of a clipping circuit according to the present invention.

Referring now to FIG. 13, there is shown a block diagram of clipping circuit 1113. A signal 1301 comes from unclipped result register 1111, and includes 15 bits plus a sign bit. Sign bit is fed to an AND gate 1303, while all other bits are fed to OR gates 1304. Positive overflow signal 1114 is fed to OR gates 1304, and is also inverted and fed to an AND gate 1303. Outputs of OR gates 1304 are fed to AND gates 1306. The output of AND gate 1303 is fed to an OR gate 1305. Negative overflow signal 1116 is fed to OR gate 1305, and is also inverted and fed to AND gates 1306. A clipped signal 1302 comprises outputs of AND gates 1305, together with the output of OR gate 1305 as a sign bit. Signal 1302 is then sent to result register 1115.

Therefore, if neither signal 1114 nor signal 1116 is set, clipped signal 1302 will be identical to signal 1301. If signal 1114 is set, the output of OR gates 1303 will be "1", while the output of AND gate 1303 will be "0". Thus, signal 1302 will represent a maximum value. If signal 1116 is set, the output of AND gates 1306 will be "0", while the output of OR gate 1305 will be "1". Thus, signal 1302 will represent a minimum value.

Therefore, the invention provides a novel and advantageous system and method of compressing a digital signal using scaled quantization of variable-sized packets of difference samples.

What is claimed is:

1. A method of generating a compressed digital signal from a source signal having a plurality of successive source samples, the signal having a beginning and an end, the method comprising the steps of:
   (a) for each source sample except a first source sample, subtracting an immediately preceding source sample from the source sample to generate a difference sample;
   (b.1) defining a plurality of packet boundaries to partition the difference samples into a plurality of successive packets of predefined sizes, each packet having a beginning and an end and comprising a contiguous subset of the difference samples, wherein:
      the beginning of a first packet is defined by the beginning of the signal;
      the end of a last packet is defined by the end of the signal; and
      the end of the first packet, the beginning of the last packet, and the beginning and end of each other packet are defined by packet boundaries;
   (b.2) adjusting the packet boundaries to change the sizes of at least a subset of the packets;
   (c) for each packet, performing the steps of:
      (c.1) determining a scale value representing a multiplier for obtaining a decompressed sample from a scaled sample; and
      (c.2) for each difference sample in the packet, generating a scaled sample using the scale value; and
   (d) outputting a signal representing the packet boundaries, scaled samples, and scale values.

2. The method of claim 1, wherein step (b.2) comprises the substeps of:
   (b.2.1) determining a difference amplitude for each packet;
   (b.2.2) designating all packet boundaries as unmarked;
   (b.2.3) selecting an unmarked packet boundary;
   (b.2.4) selectively repositioning the selected packet boundary;
   (b.2.5) marking the selected packet boundary;
   (b.2.6) determining whether any unmarked packet boundaries remain; and
   (b.2.7) responsive to any unmarked packet boundaries remaining, repeating steps (b.2.3) through (b.2.7).

3. The method of claim 1, wherein step (b.2) comprises the substeps of:
   (b.2.1) determining a difference amplitude for each packet;
   (b.2.2) designating all packet boundaries as unmarked;
   (b.2.3) for each unmarked packet boundary, determining a boundary differential by subtracting the difference amplitude of the immediately succeeding packet from the difference amplitude of the immediately preceding packet;
   (b.2.4) selecting the unmarked packet boundary having the largest-magnitude boundary differential;
   (b.2.5) responsive to the boundary differential of the selected unmarked packet boundary having a magnitude not equal to zero, performing the substeps of:
      (b.2.5.1) selectively repositioning the selected packet boundary;
      (b.2.5.2) marking the selected packet boundary;
      (b.2.5.3) determining whether any unmarked packet boundaries remain; and
      (b.2.5.4) responsive to any unmarked packet boundaries remaining, repeating steps (b.2.3) through (b.2.5).

4. The method of claim 3, wherein step (b.2.1) comprises, for each packet, determining the largest-magnitude difference sample in the packet to obtain a difference amplitude.

5. The method of claim 3, wherein step (b.2.5.1) comprises the substeps of:
   (b.2.5.1.1) determining a tolerance value representing a maximum permissible increase in difference amplitude for any packet;
   (b.2.5.1.2) comparing the difference amplitude of the packet immediately succeeding the selected packet boundary with the difference amplitude of the immediately preceding packet to designate the packet having the smaller difference amplitude as the expanding packet and the packet having the larger difference amplitude as the shrinking packet; and
   (b.2.5.1.3) selecting a difference sample immediately adjacent to the selected packet boundary and belonging to the shrinking packet;
   (b.2.5.1.4) comparing the magnitude of the selected difference sample with the sum of the difference amplitude of the expanding packet and the tolerance value;
   (b.2.5.1.5) responsive to the comparison in step (b.2.5.1.4) indicating that the magnitude of the selected difference sample exceeds the sum, performing the substeps of:
      (b.2.5.1.5.1) determining whether the selected packet boundary was repositioned; and
      (b.2.5.1.5.2) responsive to the selected packet boundary having been repositioned, determining a new difference amplitude for the expanding packet; and
   (b.2.5.1.6) responsive to the comparison in step (b.2.5.1.4) indicating that the magnitude of the selected difference sample does not exceed the sum, performing the substeps of:
      (b.2.5.1.6.1) repositioning the selected packet boundary so that the selected packet includes the selected difference sample; and
      (b.2.5.1.6.2) repeating steps (b.2.5.1.3) through (b.2.5.1.6).

6. The method of claim 1, wherein the source signal comprises an audio signal.

7. The method of claim 1, wherein the source signal comprises a video signal.

8. The method of claim 1, wherein the source signal comprises a plurality of sectors, each sector containing a subset of the source samples, and wherein steps (a) through (d) are performed for each sector.

9. (New) The method of claim 8, wherein step (c.2) comprises, for each difference sample in the packet, dividing the difference sample by the scale value of the packet.

10. A method of generating a compressed digital signal from a source signal having a plurality of successive source samples, the signal having a beginning and an end, the method comprising the steps of:

(a) for each source sample except a first source sample, subtracting an immediately preceding source sample from the source sample to generate a difference sample;

(b) defining a plurality of packet boundaries to partition the difference samples into a plurality of successive packets, each packet having a beginning and an end and comprising a contiguous subset of the difference samples, wherein:
the beginning of a first packet is defined by the beginning of the signal;
the end of a last packet is defined by the end of the signal; and
the end of the first packet, the beginning of the last packet, and the beginning and end of each other packet are defined by packet boundaries;

(c) for each packet, performing the steps of:
(c.1.1) establishing a maximum permissible value for scaled samples;
(c.1.2) determining the largest-magnitude difference sample in the packet to obtain a difference amplitude;
(c.1.3) dividing the difference amplitude by the maximum permissible value to obtain a scale value representing a multiplier for obtaining a decompressed sample from a scaled sample;
(c.2) for each difference sample in the packet, generating a scaled sample using the scale value; and (d) outputting a signal representing the packet boundaries, scaled samples, and scale values.

11. A method of generating a compressed digital signal from a source signal having a plurality of successive source samples, the signal having a beginning and an end, the method comprising the steps of:

(a) for each source sample except a first source sample, subtracting an immediately preceding source sample from the source sample to generate a difference sample;

(b) defining a plurality of packet boundaries to partition the difference samples into a plurality of successive packets, each packet having a beginning and an end and comprising a contiguous subset of the difference samples, wherein:
the beginning of a first packet is defined by the beginning of the signal;
the end of a last packet is defined by the end of the signal; and the end of the first packet, the beginning of the lost packet, and the beginning and end of each other packet are defined by packet boundaries;

(c) for each packet, performing the substeps of:
(c.1) determining a scale value representing a multiplier for obtaining a decompressed sample from a scaled sample; and
(c.2) for each source sample in the packet except the first source sample in the signal, performing the substeps of:
(c.2.1) establishing an immediately preceding source sample as a reference source sample;
(c.2.2) determining a reference sample corresponding to the reference source sample;
(c.2.3) subtracting the source sample from the reference sample to obtain a practical difference sample; and
(c.2.4) dividing the practical difference sample by the scale value to obtain a scaled sample; and (d) outputting a signal representing the packet boundaries, scaled samples, and scale values.

12. The method of claim 11, wherein substep (c.2.2) comprises the substeps of:
(c.2.2.1) responsive to the reference source sample being the first source sample in the signal, determining the reference sample to be equal to the reference source sample; and
(c.2.2.2) responsive to the reference source sample not being the first source sample in the signal, determining the reference sample according to the equation:

$$r(N)=r(N-1)+s(N)*v,$$

where:
r(N) is the reference sample;
r(N−1) is the reference sample immediately preceding the reference source sample;
s(N) is the scaled sample corresponding to the reference source sample; and
v is the scale value of the corresponding packet.

13. The method of claim 11, further comprising the step of:
(a.1) establishing a maximum permissible value for scaled samples; and wherein step (c) further comprises the substeps of:
(c.3) determining whether any of the scaled samples in the packet exceed the maximum permissible value; and
(c.4) responsive to any of the scaled samples in the packet exceeding the maximum permissible value, performing the substeps of:
(c.4.1) increasing the scale value; and
(c.4.2) repeating substeps (c.2) through (c.4).

14. The method of claim 11,
further comprising the step of (a') providing a lookup table defining a mapping between a set of scaled sample values and a set of encoded states;
and wherein substep (c.2) further comprises the substep of (c.2.5) selectively determining an encoded state for the scaled sample according to the lookup table;
and wherein step (e) comprises outputting a signal representing the encoded states and the scale values.

15. The method of claim 11,
further comprising the steps of (a') providing a plurality of lookup tables, each defining a mapping between a set of scaled sample values and a set of encoded states;
and wherein step (c.2) further comprises the substep of (c.2.5) selectively determining an encoded state for the scaled sample according to each lookup table;
and further comprising the steps of:
(c'.1) determining an error value for each lookup table; and
(c'.2) selecting the lookup table having the lowest error value; and wherein step (e) comprises outputting a signal representing the lookup table selection, the encoded states, and the scale values.

16. The method of claim 11, further comprising the steps of (a') providing a plurality of lookup tables, each defining a mapping between a set of scaled sample values and a set of encoded states;

and wherein step (c.2) further comprises the substep of (c.2.5) selectively determining an encoded state for the scaled sample according to each lookup table;

and wherein step (c) further comprises the substeps of:
(c.3) determining an error value for each lookup table; and
(c.4) selecting the lookup table having the lowest error value;

and wherein step (e) comprises outputting a signal representing the packet boundaries, the lookup table selection for each packet, the encoded states, and the scale values.

17. A method of generating a compressed digital signal from a source signal having a plurality of sectors, each sector having a beginning and an end and containing a plurality of successive source samples, the method comprising the steps of, for each sector:

(a) for each source sample except a first source sample, subtracting an immediately preceding source sample from the source sample to generate a difference sample;

(b) defining a plurality of packet boundaries to partition the difference samples into a plurality of packets of predefined sizes, each packet having a beginning and an end and comprising a contiguous subset of the difference samples, wherein:
the beginning of a first packet is defined by the beginning of the sector;
the end of a last packet is defined by the end of the sector; and
the end of the first packet, the beginning of the last packet, and the beginning and end of each other packet are defined by pocket boundaries;

(c) for each packet, determining the largest-magnitude absolute difference sample in the packet to obtain a difference amplitude for the packet;

(d) designating all packet boundaries as unmarked;

(e) for each unmarked packet boundary, determining a boundary differential by subtracting the difference amplitude of the immediately succeeding packet from the difference amplitude of the immediately preceding packet;

(f) selecting the unmarked packet boundary having the largest-magnitude boundary differential;

(g) responsive to the boundary differential of the selected unmarked packet boundary having a magnitude not equal to zero, performing the substeps of:
(g.1) selectively repositioning the selected packet boundary;
(g.2) marking the selected packet boundary;
(g.3) determining whether any unmarked packet boundaries remain; and
(g.4) responsive to any unmarked packet boundaries remaining, repeating steps (e) through (g);

(h) establishing a maximum permissible value for scaled samples (i) for each packet, performing the substeps of:
(i.1) determining a scale value representing a multiplier for obtaining a decompressed sample from a scaled sample;
(i.2) for each source sample in the packet except the first source sample in the sector, performing the substeps of:

(i.2.1) establishing an immediately preceding source sample as a reference source sample;
(i.2.2) responsive to the reference source sample being the first source sample in the sector, determining a reference sample to be equal to the reference source sample;
(i.2.3) responsive to the reference source sample not being the first source sample in the sector, determining a reference sample according to the equation:

$$r(N)=r(N-1)+s(N)*v,$$

where:
$r(N)$ is the reference sample;
$r(N-1)$ is the reference sample immediately preceding the reference source sample;
$s(N)$ is the scaled sample corresponding to the reference source sample; and
$v$ is the scale value of the corresponding packet;
(i.2.4) subtracting the source sample from the reference sample to obtain a practical difference sample; and
(i.2.5) dividing the practical difference sample by the scale value to obtain a scaled sample;
(i.3) determining whether any of the scaled samples in the packet exceed the maximum permissible value; and
(i.4) responsive to any of the scaled samples in the packet exceeding the maximum permissible value, performing the substeps of:
(i.4.1) increasing the scale value; and
(i.4.2) repeating substeps (i.2) through (i.4); and (j) outputting a signal representing the first source sample, packet boundaries, scaled samples, and scale values.

18. The method of claim 17, wherein substep (g.1) comprises the substeps of:
(g.1.1) determining a tolerance value representing a maximum permissible increase in difference amplitude for any packet;
(g.1.2) comparing the difference amplitude of the packet immediately succeeding the selected packet boundary with the difference amplitude of the immediately preceding packet to designate the packet having the smaller difference amplitude as the expanding packet and the packet having the larger difference amplitude as the shrinking packet; and
(g.1.3) selecting a difference sample immediately adjacent to the selected packet boundary and belonging to the shrinking packet;
(g.1.4) comparing the magnitude of the selected difference sample with the sum of the difference amplitude of the expanding packet and the tolerance value;
(g.1.5) responsive to the comparison in step (g.1.4) indicating that the magnitude of the selected difference sample exceeds the sum, performing the substeps of:
(g.1.5.1) determining whether the selected packet boundary was repositioned; and
(g.1.5.2) responsive to the selected packet boundary having been repositioned, determining a new difference amplitude for the expanding packet; and
(g.1.6) responsive to the comparison in step (g.1.4) indicating that the magnitude of the selected difference sample does not exceed the sum, performing the substeps of:
(g.1.6.1) repositioning the selected packet boundary so that the selected packet includes the selected difference sample; and (g.1.6.2) repeating steps (g.1.3) through (g.1.6).

19. A method of decompressing a compressed digital signal having at least one sector, each sector comprising at least one packet, each packet comprising at least one scaled sample, wherein a first packet of each sector includes a start value representing a first sample of the sector, the method comprising the steps of, for each sector:

(a) obtaining the start value;
(b) storing the start value as a decompressed sample;
(c) outputting the start value;
(d) for each packet in the sector, performing the substeps of:
  (d.1) obtaining a scale value for the packet, the scale value representing a multiplier for obtaining a decompressed sample from a scaled sample;
  (d.2) for each scaled sample in the packet, performing the substeps of:
    (d.2.1) multiplying the scaled sample by the scale value to generate a difference sample;
    (d.2.2) adding the difference sample to a previously stored decompressed sample to generate a decompressed sample;
    (d.2.3) storing the decompressed sample; and
    (d.2.4) outputting the decompressed sample.

20. A system for generating a compressed digital signal from a source signal having a plurality of successive source samples, the signal having a beginning and an end, the system comprising:

an input device for accepting input containing the source samples;

a difference sample generator, coupled to the input device, for generating a plurality of difference samples from the source samples; a packet partitioner, coupled to the difference sample generator, for defining a plurality of packet boundaries to partition the difference samples into a plurality of packets, each packet having a beginning and an end and comprising a contiguous subset of the difference samples, wherein:
  the beginning of a first packet is defined by the beginning of the signal;
  the end of a last packet is defined by the end of the signal; and
  the end of the first packet, the beginning of the last packet, and the beginning and end of each other packet are defined by packet boundaries;

a packet boundary adjuster, coupled to the packet partitioner, for changing the sizes of at least a subset of the packets by adjusting packet boundaries;

a scale value generator, coupled to the packet partitioner, for generating a scale value for each packet, the scale values representing multipliers for obtaining decompressed samples from scaled samples;

a scaled sample generator, coupled to the difference sample generator, for generating a plurality of scaled samples from the difference samples and the scale values; and an output device, coupled to the scaled sample generator and the scale value generator, for outputting a first source sample of the source signal, packet boundaries, scaled samples, and scale values.

21. A system for decompressing a compressed digital signal, comprising:

a parser for extracting at least one start value, scaled samples, and scale values from the compressed digital signal, the start value representing a first sample of the signal and the scale values representing multipliers for obtaining decompressed samples from the scaled samples;

a result register for initially storing the start value and subsequently storing decompressed samples;

a multiplier, coupled to the parser, for multiplying the scaled samples by the scale values to generate values representing differences between adjacent decompressed samples;

an adding device, coupled to the multiplier, for adding the generated values to the contents of the result register to obtain decompressed samples; and an output device coupled to the adding device, for outputting the decompressed samples;

wherein the result register is coupled to the parser and to the adding device.

22. The system of claim 21, wherein the adding device comprises:
a selectable inverter; and
a full adder coupled to the selectable inverter.

23. The system of claim 21, further comprising:
an overflow detection circuit coupled to the result register for detecting result overflow; and
a selectable clipper coupled to the overflow detection circuit for selectively clipping the result register responsive to result overflow.

24. The system of claim 23, wherein the result register comprises a plurality of magnitude bits and a sign bit, and wherein the overflow detection circuit comprises:
a positive overflow signal generator coupled to the result register; and
a negative overflow signal generator coupled to the result register;
and wherein the selectable clipper comprises:
a first inverter having an input coupled to the positive overflow signal generator and an output;
a sign-bit AND gate having a first input coupled to the sign bit of the result register, a second input coupled to the output of the first inverter, and an output;
a plurality of OR gates, each having a first input coupled to a magnitude bit of the result register, a second input coupled to the positive overflow signal generator, and an output;
a sign-bit OR gate having a first input coupled to the output of the sign-bit AND gate, a second input coupled to the negative overflow signal generator, and an output coupled to the output device, for generating a selectively clipped sign bit;
a second inverter having an input coupled to the negative overflow signal and an output; and
a plurality of AND gates, each having a first input coupled to the output of one of the OR gates, a second input coupled to the output of the second inverter, and an output coupled to the output device, for generating a selectively clipped signal.

* * * * *